United States Patent
Bencivenga et al.

(10) Patent No.: US 9,477,805 B2
(45) Date of Patent: Oct. 25, 2016

(54) LOGICAL EQUIVALENCY CHECK WITH DYNAMIC MODE CHANGE

(71) Applicant: Mentor Graphics Corporation, Wilsonville, OR (US)

(72) Inventors: Robert Bencivenga, Westford, MA (US); James Henson, Bend, OR (US); Aaik van der Poel, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/609,871

(22) Filed: Jan. 30, 2015

(65) Prior Publication Data

US 2016/0224714 A1 Aug. 4, 2016

(51) Int. Cl.
  *G06F 9/455* (2006.01)
  *G06F 17/50* (2006.01)
(52) U.S. Cl.
  CPC .................. *G06F 17/5081* (2013.01)
(58) Field of Classification Search
  CPC ............. G06F 17/504; G06F 17/5022; G06F 17/505; G06F 17/5081; G06F 2217/64; G06F 2217/78; G06F 2217/84
  See application file for complete search history.

(56) References Cited

U.S. PATENT DOCUMENTS

| | | | | |
|---|---|---|---|---|
| 6,408,424 B1* | 6/2002 | Mukherjee | ..... | G01R 31/318357 716/106 |
| 7,266,790 B2* | 9/2007 | Pandey | ................. | G06F 17/504 716/107 |
| 7,376,919 B1* | 5/2008 | McElvain | ............. | G06F 17/504 716/103 |
| 8,099,703 B1* | 1/2012 | Manovit | ............... | G06F 17/504 716/103 |
| 8,978,001 B1* | 3/2015 | Kailas | ................. | G06F 17/5081 716/111 |
| 2004/0098683 A1* | 5/2004 | Maruyama | .......... | G06F 17/5022 716/107 |
| 2005/0289486 A1* | 12/2005 | Caron | ................... | G06F 17/504 716/107 |
| 2006/0225008 A1* | 10/2006 | Schleicher | ............ | G06F 17/505 716/104 |
| 2007/0143717 A1* | 6/2007 | Koelbl | .................. | G06F 17/504 716/103 |
| 2009/0300563 A1* | 12/2009 | Moon | ................. | G06F 17/5031 716/106 |
| 2010/0199241 A1* | 8/2010 | Baumgartner | ........ | G06F 17/504 716/103 |
| 2011/0214096 A1* | 9/2011 | Sheeley | ................ | G06F 17/504 716/107 |
| 2014/0129998 A1* | 5/2014 | Shrivastava | .......... | G06F 17/504 716/103 |

* cited by examiner

*Primary Examiner* — Nha Nguyen
(74) *Attorney, Agent, or Firm* — Banner & Witcoff, Ltd.

(57) ABSTRACT

This application discloses a system implementing tools and mechanisms to determine whether a portion of combinational logic in a first circuit design is equivalent to a portion of combinational logic in a second circuit design. When the portions of the combinational logic in the first circuit design and the second circuit design are not equivalent, the tools and mechanisms can sequentially expand the portions of the combinational logic in the first circuit design and the second circuit design, and determine whether the expanded portion of the combinational logic in the first circuit design is equivalent the expanded portion of the combinational logic in the second circuit design.

15 Claims, 6 Drawing Sheets

LOGICAL EQUIVALENCY CHECK WITH DYNAMIC MODE CHANGE

TECHNICAL FIELD

This application is generally related to electronic design automation and, more specifically, to logical equivalency check.

BACKGROUND

Designing and fabricating electronic devices typically involves many steps, known as a "design flow." The particular steps of a design flow often are dependent upon the type of circuitry, its complexity, the design team, and the device fabricator or foundry that will manufacture the electronic device. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). At various stages of the design flow, the design is transformed into a different representation, for example, the transformation of the design from an RTL representation to a gate-level netlist representation during synthesis, the transformation of the gate-level netlist to a physical design layout, or the like. These transformations are intended to convert the design into an equivalent representation, albeit at a different level of abstraction than the previous representation of the design, which retains the functionality of the design. To help ensure that a transformation did not alter the functionality of the design, an equivalence of the different design representations can be determined, for example, using formal techniques provided by a Binary Decision Diagram (BDD) tool, a Satisfiability Prover (SAT) tool, an Automatic Test Pattern Generator (ATPG) tool, or the like. Typically, an equivalence checking tool utilizes a matching register hypothesis, which assumes that the different design representations each have combinational logic with the same functionality located between registers. This assumption of a 1-to-1 correspondence between registers in the different design representations, allows the equivalence checking tool to sub-divide the different design representations into combinational logic portions based on the locations of their registers and perform the formal techniques on those portions to determine whether they are equivalent.

Modern circuit design synthesis, however, often utilizes optimizations when converting one design representation into another design representation, which can invalidate the matched register hypothesis. For example, a synthesis engine can perform various timing optimizations that can move combinational logic in the synthesized design representation across a register boundary. The synthesis engine also can perform state minimization, state encoding, sequential-redundancy removal and addition, which can alter a structure of the design representations. Since this type of optimization renders the combinational logic located between registers different for the different design representations, the matched register hypothesis becomes invalid for that portion of the design representations.

Some equivalency checking engineers have attempted to cure the loss of the matched register hypothesis caused by the optimizations by altering the original design representation to recreate the 1-to-1 register matching between the designs. For example, these equivalency checking engineers often utilize a guidance file, which can describe the optimizations performed by a synthesis engine, to reconstruct the combinational logic optimizations in the original design representation in order to reestablish the matching register hypothesis. This approach, however, avails itself to many reconstruction flaws and eliminates independent analysis of whether the synthesis engine generated a design representation that is equivalent to the original design representation that was synthesized.

Another proposed technique to formally verify structurally transformed designs is referred to as sequential equivalence checking. Sequential equivalence checking traverses a state space of the two design representations prior to verification, often consuming significantly more computational resources than conventional formal verification techniques require. Since the state space increases exponentially with based on the size of the circuit design, it is often not feasible to formally utilize sequential techniques for equivalence checking.

SUMMARY

This application discloses a system implementing tools and mechanisms to determine whether a portion of combinational logic in a first circuit design is equivalent to a portion of combinational logic in a second circuit design. When the portions of the combinational logic in the first circuit design and the second circuit design are not equivalent, the tools and mechanisms can sequentially expand the portions of the combinational logic in the first circuit design and the second circuit design, and determine whether the expanded portion of the combinational logic in the first circuit design is equivalent the expanded portion of the combinational logic in the second circuit design.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
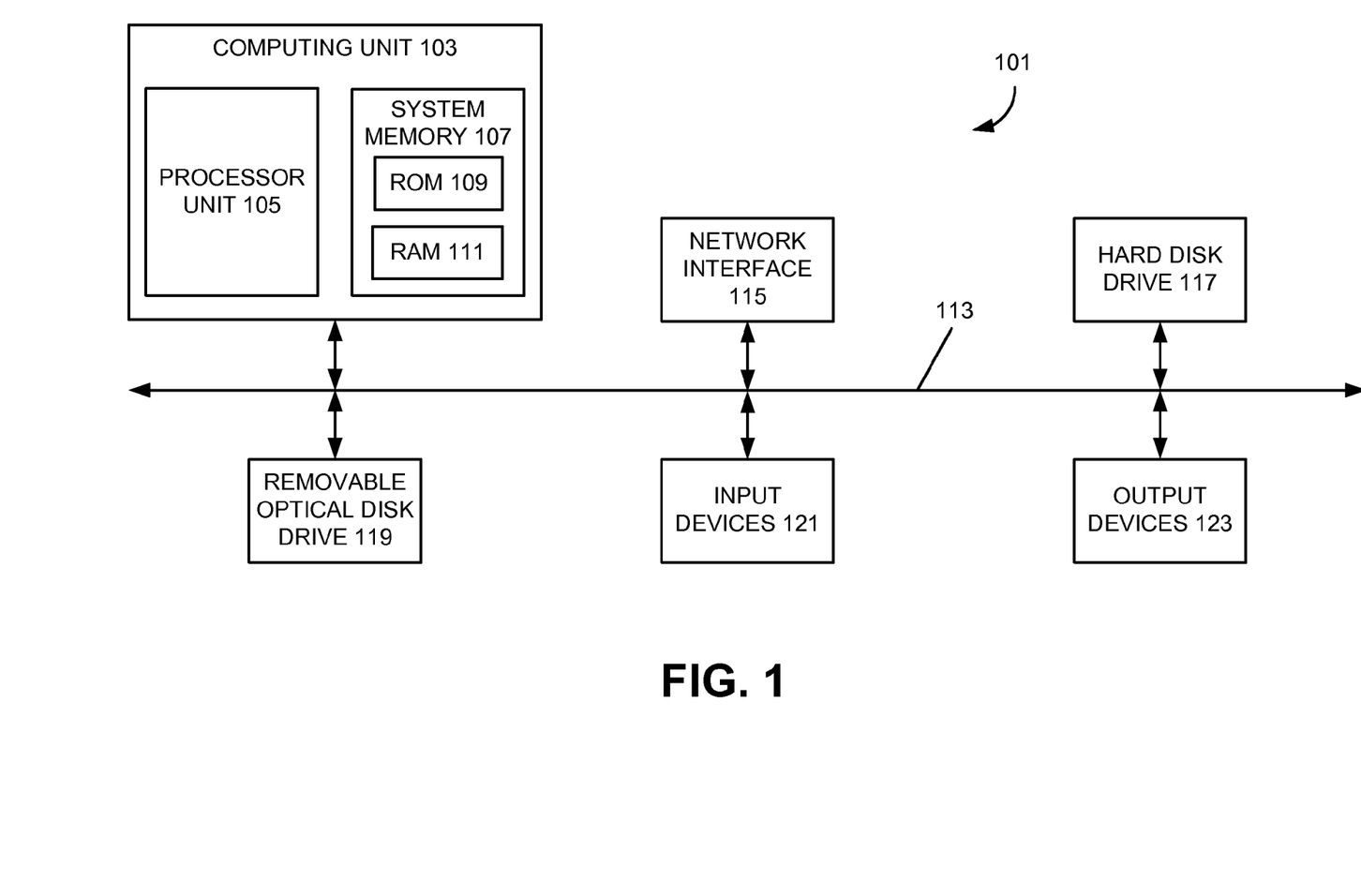
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
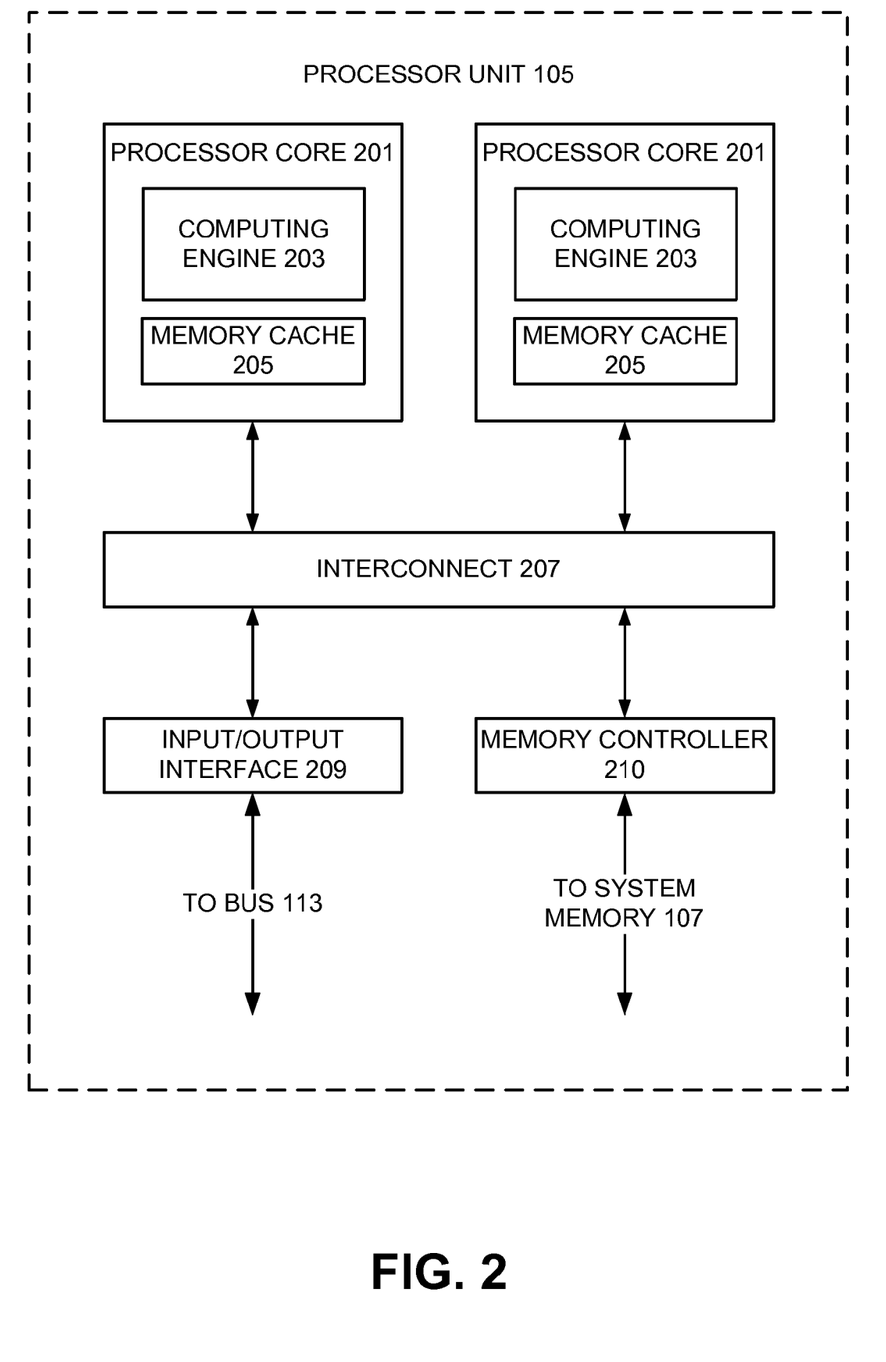

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Logical Equivalence Check with Dynamic Mode Change

Figure 3:
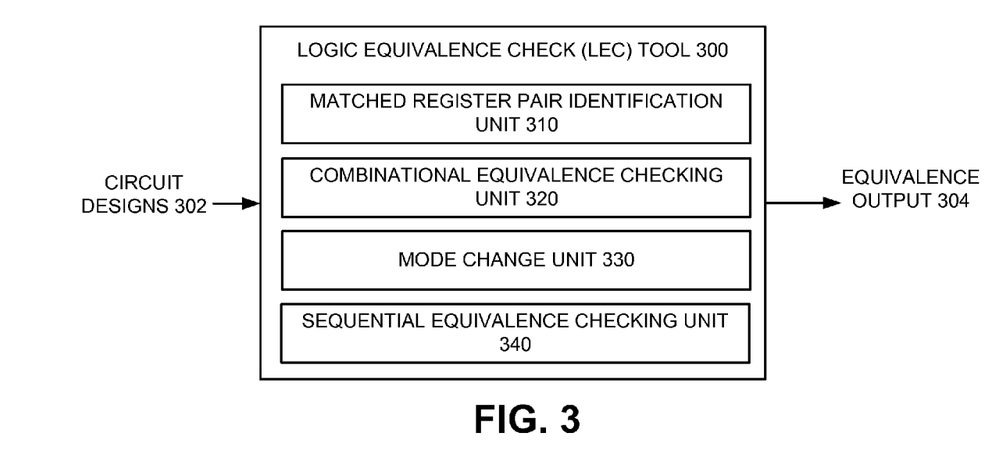
FIG. 3 illustrates an example logic equivalence check (LEC) tool capable of determining equivalence of multiple circuit designs utilizing a dynamic mode change according to various embodiments of the invention.

FIG. 3 illustrates an example logic equivalence check (LEC) tool 300 capable of determining equivalence of multiple circuit designs 302 utilizing a dynamic mode change according to various embodiments of the invention. Referring to FIG. 3, the logic equivalence check tool 300 can receive the multiple circuit designs 302, which in some cases can be different representations of a common design, for example, at different levels of abstraction, such as a register transfer level (RTL) representation, a gate-level netlist representation, a physical design layout representation, or the like. The logic equivalence check tool 300 can perform a formal equivalence check on combinational logic in the multiple circuit designs 302 and generate an equivalence output 304 that can indicate whether the combinational logic in the multiple circuit designs 302 is equivalent. In some embodiments, when the equivalence output 304 indicates the combinational logic is not equivalent between the multiple circuit designs 302, the equivalence output 304 can identify which portions of the combinational logic are not equivalent between the multiple circuit designs 302.

The logic equivalence checking tool 300 can utilize a matched register pair hypothesis when determining equivalence between the circuit designs 302. The matched register pair hypothesis assumes that each register in one of the circuit designs 302 matches a corresponding register in another one of the circuit designs 302, such that each register in a matching pair has an input coupled to combinational logic that is functionally equivalent.

Figure 4:
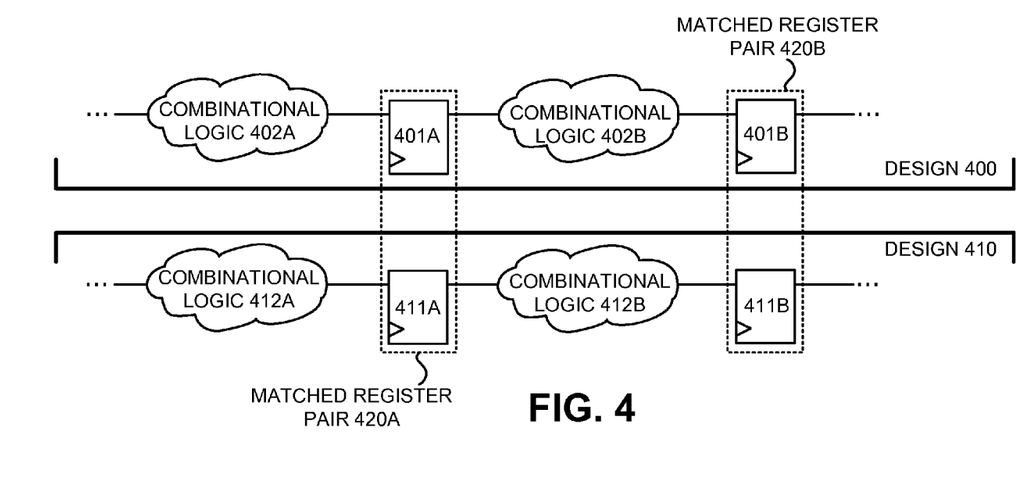
FIG. 4 illustrates an example of a matching pair hypothesis in multiple circuit designs 400 and 410 according to various embodiments of the invention.

FIG. 4 illustrates an example of a matching pair hypothesis in multiple circuit designs 400 and 410 according to various embodiments of the invention. Referring to FIG. 4, the circuit design 400 can include combinational logic 402A and 402B coupled to inputs of registers 401A and 401B, respectively. The circuit design 410 can include combinational logic 412A and 412B coupled to inputs of registers 411A and 411B, respectively.

A matching pair hypothesis for the circuit designs 400 and 410 would match each of the registers 401A and 401B in the circuit design 400 to corresponding registers 411A and 411B in the circuit design 410 based on an expected functionality of the combinational logic 402A-402B and 412A-412B. For example, the register 401A in circuit design 400 can be matched to the register 411A in circuit design 410 to form a matched register pair 420A. The register 401B in circuit design 400 can be matched to the register 411B in circuit design 410 to form a matched register pair 420B. Since the assumption that combinational logic coupled to a common matched register pair is functionally equivalent, during logic equivalence checks, a logic equivalence check tool can leverage the matched register pairs 420A and 420B to guide the equivalence tests for the combinational logic 402A-402B and 412A-412B. Although FIG. 4 utilizes matched registers to illustrate the matching pair hypothesis, the circuit designs 400 and 410 can also match output ports, which, in some cases can be user defined.

Referring back to FIG. 3, the logic equivalence check tool 300 can include a matched register pair identification unit 310 to identify matched register pairs in the circuit designs 302. Since the presence of matched pair of registers assumes 1-to-1, 1-to-N, or N-to-1 correspondence between registers in the circuit designs 302, the identification of matched pair of registers can allow the matched register pair identification unit 310 to sub-divide the combinational logic in the circuit designs 302 based on the locations of the matched pairs of registers.

The logic equivalence check tool 300 can include a combinational equivalence checking unit 320 to analyze combinational logic on a per matched register pair basis, for example, using formal techniques provided by a Binary Decision Diagram (BDD) tool, a Satisfiability Prover (SAT) tool, an Automatic Test Pattern Generator (ATPG) tool, or the like. The combinational equivalence checking unit 320 can identify portions of the combinational logic from the circuit designs 302 to analyze for equivalence to each other based on the matched pairs of registers in the circuit designs 302. When the analysis of the portions of the combinational logic indicates that they are equivalent, the logic equivalence check tool 300 can record their equivalence and proceed to analyzing different portions of the combinational logic from the circuit designs 302. In some embodiments, the different portions of the combinational logic from the circuit designs 302 can be sequentially following the previously analyzed portions of the combinational logic from the circuit designs 302. In other embodiments, the logic equivalence check tool 300 can perform parallel equivalence checking on the combinational logic in the circuit designs 302. For example, the logic equivalence check tool 300 can divide the combinational logic into multiple portions, and the equivalence checking on the portions of the combinational logic can be performed in parallel, for example, on different processing cores.

When the analysis of the portions of the combinational logic indicates that they are not equivalent, the logic equivalence check tool 300 can dynamically change an analysis mode for the logic equivalence check tool 300 into a sequential equivalence check mode. The logic equivalence check tool 300 can include a mode change unit 330 to analyze results of equivalence checking by the combinational equivalence checking unit 320 and dynamically change to the sequential equivalence check mode in response to the combinational equivalence checking unit 320 determining combinational logic input to a matched register pair is not equivalent to each other.

The logic equivalence check tool 300 can include a sequential equivalence checking unit 340 to iteratively expand the non-equivalent combinational logic and perform a sequential equivalence check on the expanded combinational logic, for example, with a sequential theorem solver. In some embodiments, the sequential equivalence checking unit 340 can expand the non-equivalent combinational logic corresponding to one matched register pair by combining it with combinational logic corresponding to an adjacent (or sequentially subsequent) matched register pair in the circuit designs 302. In some examples, the sequential equivalence checking unit 340 can perform a sequential equivalence check on the combinational logic corresponding to the adjacent matched register pair in the circuit designs 302 utilizing the output of the non-equivalent combinational logic determined by the combinational equivalence checking unit 320.

In the sequential equivalence check mode, the sequential equivalence checking unit 340 can implement a sequential algorithm that can model registers in the circuit designs 302 as sequential elements. Conversely, the combinational equivalence checking unit 320, in the combinational equivalence check mode, can implement a combinational algorithm that can interpret a presence of registers as combinational elements or just gates. By including the mode change unit 330 in the logic equivalence check tool 300, the same circuit designs 302 can feed both the combinational equivalence checking unit 320 and the sequential equivalence checking unit 340, which can allow the logic equivalence check tool 300 to dynamically switch between both of equivalence check modes—combinational and sequential—while being able to keep a coherent track of which portions of the circuit designs 302 have been tested for equivalence and the results of those tests.

When the sequential equivalence checking unit 340 determines, based on the sequential equivalence check, that the expanded combinational logic is equivalent to each other, the sequential equivalence checking unit 340 can record the equivalence of the expanded combinational logic and the combinational equivalence checking unit 320 can analyze different portions of the combinational logic from the circuit designs 302. When the sequential equivalence checking unit 340 determines, based on the sequential equivalence check, that the expanded combinational logic is not equivalent to each other, the sequential equivalence checking unit 340 can re-expand the expanded combinational logic by combining it with combinational logic corresponding to an adjacent (or sequentially subsequent) matched register pair in the circuit designs 302. In some examples, the combining of the combinational logic can be performed by providing the output of the non-equivalent combinational logic to the adjacent matched register pair in the circuit designs 302. For example, the sequential equivalence checking unit 340 can perform a sequential equivalence check on the combinational logic corresponding to the adjacent matched register pair in the circuit designs 302 utilizing the output of the non-equivalent combinational logic determined by the sequential equivalence checking unit 340. The sequential equivalence checking unit 340 can perform a sequential equivalence check on the re-expanded combinational logic to determine whether it is equivalent to each other. This iterative process of expanding or combining combinational logic and re-preforming the sequential equivalence check on the expanded combinational logic can continue until equivalence is determined or some preset stop point has been met. In some examples, the preset stop point can be a preset number of expansions or sequential equivalence checks, a preset quantity of combinational logic, such as a number of gates, components, features, or the like, a present time period, or the like. When the sequential equivalence checking unit 340 determines a stop point has been met, the sequential equivalence checking unit 340 can record the non-equivalence of the original combinational logic analyzed by the combinational equivalence checking unit 320 and the combinational equivalence checking unit 320 can analyze different portions of the combinational logic from the circuit designs 302.

Figure 5:
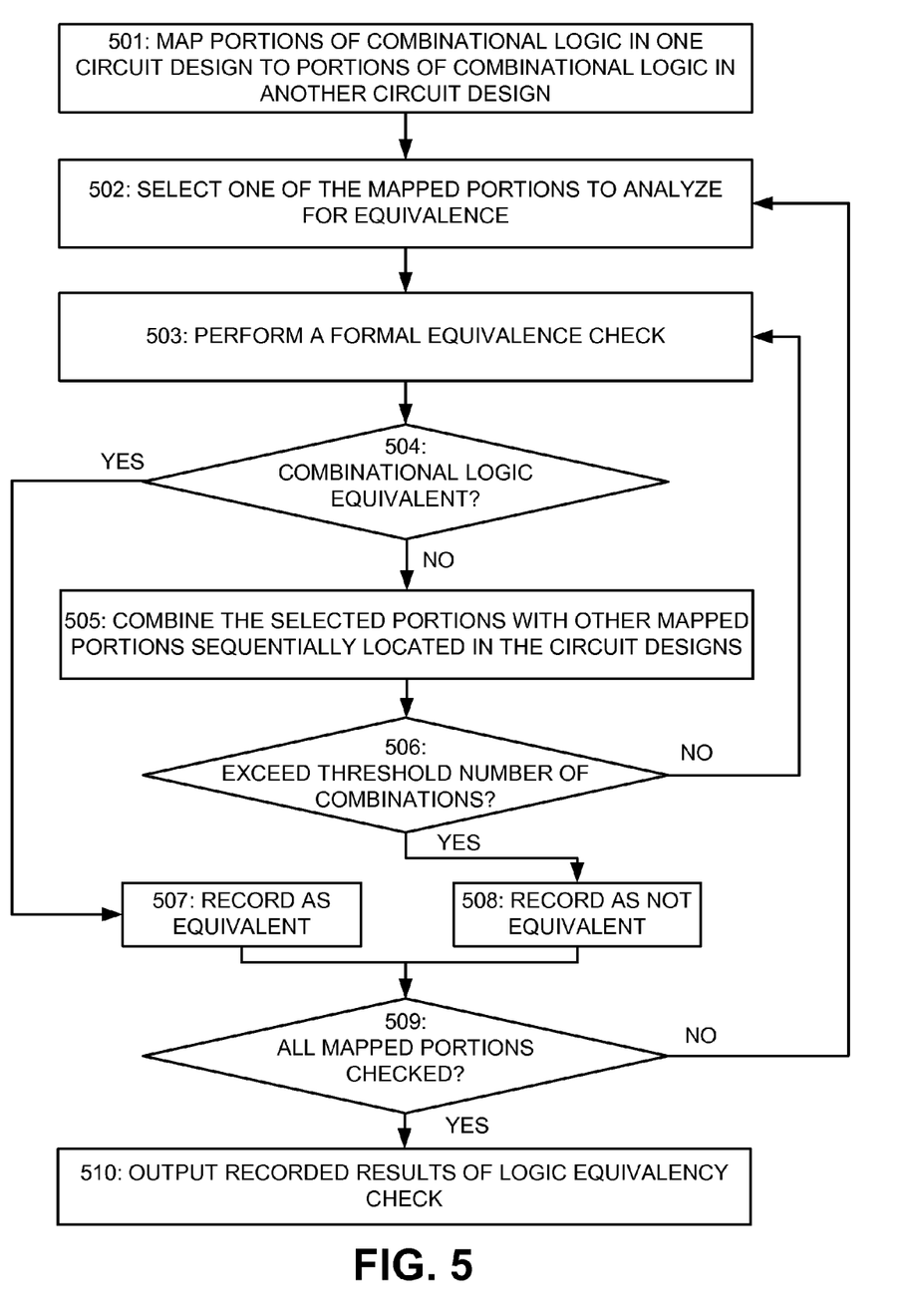
FIG. 5 illustrates a flowchart showing an example implementation of a dynamic mode change for logic equivalence checking according to various embodiments of the invention.

FIG. 5 illustrates a flowchart showing an example implementation of a dynamic mode change for logic equivalence checking according to various embodiments of the invention. Referring to FIG. 5, in a block 501, a computing system can map portions of combinational logic in one circuit design to portions of combinational logic in another circuit design. In some embodiments, the computing system can map the portions of combinational logic by identifying matched register pairs for the circuit designs and mapping combinational logic coupled to inputs of a matched register pair together.

In a block 502, the computing system can select one of the mapped portions to analyze for equivalence in a combinational equivalence check mode, and, in a block 503, the computing system can perform a formal equivalence check on the selected portions in the combinational equivalence check mode. In some embodiments, the computing system can perform a combinational equivalence check, for example, using formal techniques provided by a Binary Decision Diagram (BDD) tool, a Satisfiability Prover (SAT) tool, an Automatic Test Pattern Generator (ATPG) tool, or the like. As will be discussed below, the computing system can be in a different mode, such as a sequential equivalence check mode, in which case the computing system can perform a sequential equivalence check.

In a block 504, the computing system can determine whether the selected combinational logic is equivalent based on the formal equivalence check in the block 503. When, in block 504, the computing system determines the combinational logic is equivalent, execution can continue to block 507, where the computing system can record the selected portions as equivalent.

When, in block 504, the computing system determines the combinational logic is not equivalent, the computing system can switch to sequential equivalence check mode. In a block 505, the computing system can combine the selected portions with other mapped portions sequentially located in the circuit designs. In some embodiments, the combination of the selected portions with the other mapped portions can include providing an output of the selected portions generated during the formal equivalence check in the block 503 to the input of the other mapped portions.

In a block 506, the computing system can determine whether a threshold number of combinations has been exceeded. If in the block 506, the computing system does not exceed the threshold number of combinations, execution can return to the block 503, where the computing system performs a formal equivalence check on the combined portions in the sequential equivalence check mode, for example, by performing a sequential equivalence check with the results of the combinational equivalence check as inputs to the other mapped portions.

If in the block 506, the computing system can exceeds the threshold number of combinations, execution can proceed to a block 508, where the computing system can record the mapped portions as not equivalent. In some examples, rather than determining the threshold number of combinations has been exceeded, the computing system can utilize a different preset stop point, such as a preset number of sequential equivalence checks, a preset quantity of combinational logic, such as a number of gates, components, features, or the like, a present time period, or the like.

From either block 507 or 508, execution proceeds to a block 509, where the computing system can determine whether all of the mapped portions have been checked for equivalence. If so, execution can continue to a block 510, where the computing system can output recorded results of logic equivalency check. When all portions in the circuit designs were recorded as equivalent, the computing system can output an indication that the combinational logic in the circuit designs is equivalent. When at least one of the portions in the circuit designs was recorded as not equivalent, the computing system can output an indication that the combinational logic in the circuit designs is not equivalent, and, in some embodiments, specify which portions of the circuit designs were not equivalent.

When the computing system determines that all mapped portions have not been checked for equivalence, execution can continue to the block 502, where the computing system can select another one of the mapped portions to analyze for equivalence in a combinational equivalence check mode. In some embodiments, the selected portion can be a portion of the combinational logic that is sequentially subsequent to the previously selected portion of the combinational logic.

Figure 6A:
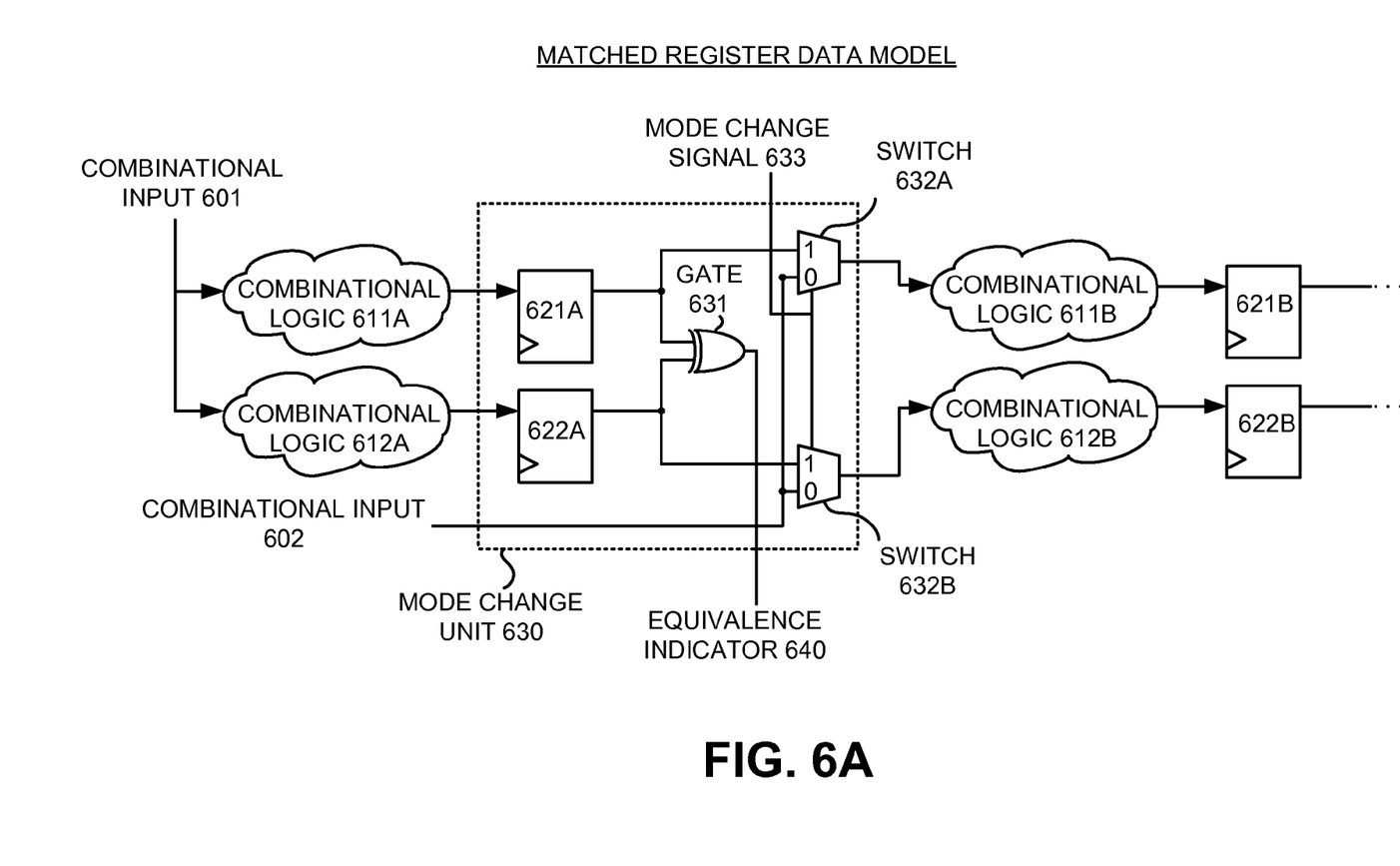
FIGS. 6A-6C illustrate an example implementation of a matched register data model utilized by a logic equivalence check (LEC) tool according to various embodiments of the invention.
Figures 6B, 6C:
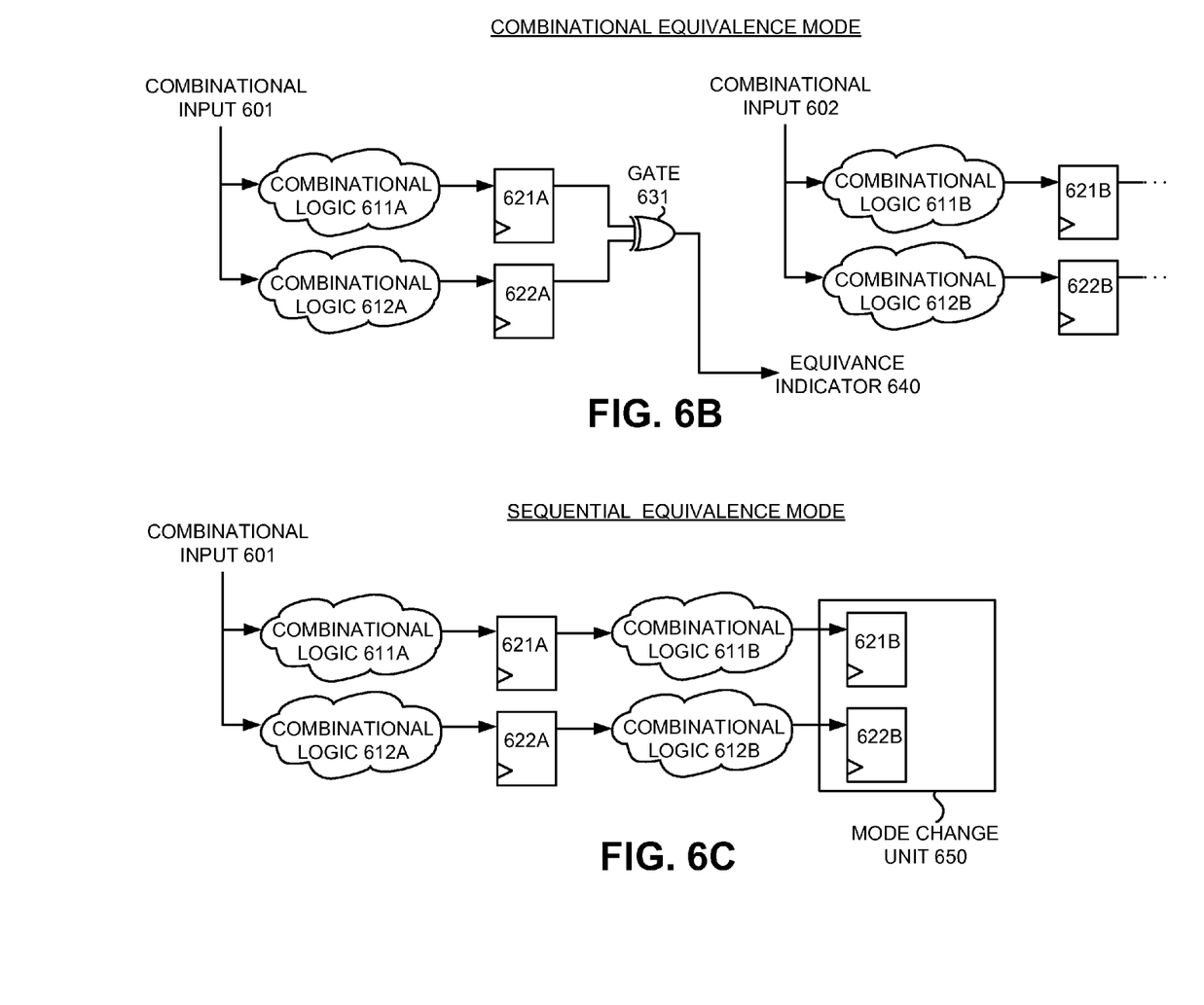

FIGS. 6A-6C illustrate an example implementation of a matched register data model utilized by a logic equivalence check (LEC) tool according to various embodiments of the invention. Referring to FIG. 6A, the matched register data model can include combinational logic 611A-611B coupled to inputs of registers 621A-621B, respectively, from one circuit design, and include combinational logic 612A-612B coupled to inputs of registers 622A-622B, respectively, from another circuit design. The matched register data model also can align the registers from the different circuit designs based on a matching pair hypothesis, i.e., where registers in one circuit design can be matched in a 1-to-1 correspondence to registers in another circuit design. In this example, registers 621A and 622A can form a matched register pair, while registers 621B and 622B can form another matched register pair. Although FIG. 6A shows a pair of matched registers 621A and 621B, in some embodiments, the matched register data model can include more than two matched registers having similar behavior, for example, when a synthesis tool elects to replicate registers for layout routing.

The logic equivalence check tool, in a combinational equivalence mode, can perform formal analysis on the combinational logic 611A and 612A receiving a common input, i.e., a combinational input 601, for example, using formal techniques provided by a Binary Decision Diagram (BDD) tool, a Satisfiability Prover (SAT) tool, an Automatic Test Pattern Generator (ATPG) tool, or the like. The outputs of this formal analysis can be provided to a mode change unit 630, which can determine whether the combinational logic 611A and 612A is equivalent. In some embodiments, the mode change unit 630 (and other similar logic located corresponding to other matched registers) can be inserted by the logic equivalence check tool before performing a combinational test or a sequential test on the combinational logic 611A-612A or 611B-612B.

The mode change unit 630 can analyze outputs from the combinational logic 611A-612A to determine whether the combinational logic 611A-612A is equivalent. The mode change unit 630 can utilize the results of the equivalence determination to set a mode for the logic equivalence check tool, i.e., in a combinational equivalence mode or in a sequential equivalence mode. In some embodiments, the mode change unit 630 can include logic, such as XOR gate 631, which can compare the outputs of the formal analysis of combinational logic 611A and 612A and output an equivalence indicator 640 to indicate whether the outputs of the formal analysis are equivalent. In some embodiments, the mode change unit 630 can utilize the signal output from the XOR gate 631 to determine which input to provide to the combinational logic 611B-612B via switches 632A-632B, respectively, which effectively can set the mode of the logic equivalence check tool. In other embodiments, the mode change unit 630 can switch into a sequential equivalence mode, i.e., providing the output of combinational logic 611A-612A to the combinational logic 611B-612B via switches 632A-632B, respectively, when the equivalence indicator 640 to indicate the combinational logic 611A-612A is equivalent.

When the results of the equivalence determination by the mode change unit 630 indicate the combinational logic 611A-612A is equivalent, the mode change unit 630 can leave the logic equivalence check tool in the combinational equivalence mode for a subsequent analysis of the combinational logic 611B-612B. For example, the mode change unit 630 can receive a mode change signal 633 from the logic equivalence check tool, which the mode change unit 630 can provide to the switches 632A-632B to dynamically switch the matched register data model into combinational equivalence mode or sequential equivalence mode. In some embodiments, the mode change unit 630, in response to the equivalence indicator 640 from the XOR gate 631, can provide a common input, i.e., a combinational input 602, to the combinational logic 611B-612B via switches 632A-632B, respectively. The combinational input 602 can be a pseudo primary input for the logic equivalence check tool, e.g., representing a single common input for the matched registers, when the mode change unit 630 is in the combinational equivalence mode. A representation of the matched register data model when the mode change unit 630 determines to set the logic equivalence check tool in the combinational equivalence mode for a subsequent analysis of the combinational logic 611B-612B is shown in FIG. 6B. The matched register data model in the combinational equivalence mode can be shown as separate combinational equivalence checks on the combinational logic 611A-612A and the combinational logic 611B-612B. The output of the XOR gate 631 also can be an equivalence indicator 640 to annunciate that the combinational logic 611A-612A is equivalent. Although not shown in FIG. 6B, the logic equivalence check tool also can control the registers 621A-622A and 621B-622B with clock signaling and asynchronous control signaling.

When the results of the equivalence determination by the mode change unit 630 indicate the combinational logic 611A-612A is not equivalent, the mode change unit 630 can set the logic equivalence check tool in the sequential equivalence mode for a subsequent analysis of the combinational logic 611B-612B. In the sequential equivalence mode, the mode change unit 630 can output the results of the formal analysis on the combinational logic 611A-612A via switches 632A-632B, respectively, which can be inputs to the combinational logic 611B-612B, respectively. Since the logic equivalence check tool can perform sequential formal analysis on the combinational logic 611B-612B utilizing the results of the formal analysis on the combinational logic 611A-612A as inputs to the combinational logic 611B-612B, the logic equivalence check tool is determining whether an aggregation of combinational logic 611A and 611B is equivalent to an aggregation of combinational logic 612A and 612B.

A representation of the matched register data model when the mode change unit 630 determines to set the logic equivalence check tool into the sequential equivalence mode for the subsequent analysis of the combinational logic 611B-612B is shown in FIG. 6C. The matched register data model can be shown as a sequential equivalence check to determine whether the aggregation of combinational logic 611A and 611B is equivalent to the aggregation of combinational logic 612A and 612B. The output of the sequential equivalence analysis, i.e., the results of the formal analysis of the combinational logic 611B-612B can be fed into another mode change unit 650. The mode change unit 650 can determine whether the aggregation of combinational logic 611A and 611B is equivalent to the aggregation of combinational logic 612A and 612B. If so, the mode change unit 650 can set the logic equivalence check tool in a combinational equivalence check mode for analysis of subsequent combinational logic (not shown). If not, the mode change unit 650 can leave the logic equivalence check tool in the sequential equivalence check mode for analysis of the subsequent combinational logic (not shown). As discussed above the logic equivalence check tool can remain in the sequential equivalence check mode until it determines aggregations of combinational logic in different designs are equivalent or until the logic equivalence check tool ascertains that they are not equivalent. Although not shown in FIG. 6C, the logic equivalence check tool also can control the registers 621A-622A and 621B-622B with clock signaling and asynchronous control signaling.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
identifying, by a computing system, matched register pairs, each having one register in a first circuit design and one register in a second circuit design;
determining, by the computing system in a combinational equivalence check mode, a portion of combinational logic, corresponding to a first matched register pair, in the first circuit design is not equivalent to a portion of combinational logic, corresponding to the first matched register pair, in the second circuit design;
switching the computing system from the combinational equivalence check mode to a sequential equivalence check mode;
sequentially expanding, by the computing system in the sequential equivalence check mode, the portions of the combinational logic in the first circuit design and the second circuit design by coupling the portions of the combinational logic corresponding to the first matched register pair to combinational logic corresponding to a second matched register pair; and
determining, by the computing system, whether the expanded portion of the combinational logic in the first circuit design is equivalent to the expanded portion of the combinational logic in the second circuit design.

2. The method of claim 1, further comprising outputting, by the computing system, a signal configured to indicate an equivalence between the expanded portion of the combinational logic in the first circuit design and the expanded portion of the combinational logic in the second circuit design.

3. The method of claim 1, wherein sequentially expanding the portions of the combinational logic in the first circuit design and the second circuit design further comprises coupling outputs from the portions of the combinational logic in the first circuit design and the second circuit design to inputs to additional portions of the combinational logic in the first circuit design and the second circuit design.

4. The method of claim 1, wherein output of the first matched register pair is input into the combinational logic corresponding to the second matched register pair.

5. The method of claim 1, further comprising:
when the expanded portions of the combinational logic in the first circuit design and the second circuit design are not equivalent, sequentially re-expanding, by the computing system, the expanded portions of the combinational logic in the first circuit design and the second circuit design; and determining, by the computing system, whether the re-expanded portion of the combinational logic in the first circuit design is equivalent to the re-expanded portion of the combinational logic in the second circuit design.

6. A system comprising:
a memory system configured to store computer-executable instructions; and
a computing system, in response to execution of the computer-executable instructions, is configured to:
identify matched register pairs, each having one register in the first circuit design and one register in the second circuit design;
determine, in a combinational equivalence check mode, a portion of combinational logic, corresponding to a first matched register pair, in the first circuit design is not equivalent to a portion of combinational logic, corresponding to the first matched register pair, in the second circuit design;
switch the computing system from the combinational equivalence check mode to a sequential equivalence check mode;
sequentially expand, in the sequential equivalence check mode, the portions of the combinational logic in the first circuit design and the second circuit design by coupling the portions of the combinational logic corresponding to the first matched register pair to combinational logic corresponding to a second matched register pair; and
determine whether the expanded portion of the combinational logic in the first circuit design is equivalent to the expanded portion of the combinational logic in the second circuit design.

7. The system of claim 6, wherein the computing system, in response to execution of the computer-executable instructions, is further configured to output a signal configured to indicate an equivalence between the expanded portion of the combinational logic in the first circuit design and the expanded portion of the combinational logic in the second circuit design.

8. The system of claim 6, wherein the computing system, in response to execution of the computer-executable instructions, is further configured to sequentially expand the portions of the combinational logic in the first circuit design and the second circuit design by coupling outputs from the portions of the combinational logic in the first circuit design and the second circuit design to inputs to additional portions of the combinational logic in the first circuit design and the second circuit design.

9. The system of claim 6, wherein output of the first matched register pair is input into the combinational logic corresponding to the second matched register pair.

10. The system of claim 6, wherein the computing system, in response to execution of the computer-executable instructions, is further configured to:
sequentially re-expand the expanded portions of the combinational logic in the first circuit design and the second circuit design when the expanded portions of the combinational logic in the first circuit design and the second circuit design are not equivalent; and determine whether the re-expanded portion of the combinational logic in the first circuit design is equivalent to the re-expanded portion of the combinational logic in the second circuit design.

11. An apparatus comprising at least one computer-readable memory device storing instructions configured to cause one or more processing devices to perform operations comprising:
identifying matched register pairs, each having one register in the first circuit design and one register in the second circuit design;
determining, in a combinational equivalence check mode, a portion of combinational logic, corresponding to a first matched register pair, in the first circuit design is not equivalent to a portion of combinational logic, corresponding to the first matched register pair, in the second circuit design;
switching from the combinational equivalence check mode to a sequential equivalence check mode;
sequentially expanding, in the sequential equivalence check mode, the portions of the combinational logic in the first circuit design and the second circuit design by coupling the portions of the combinational logic corresponding to the first matched register pair to combinational logic corresponding to a second matched register pair; and
determining whether the expanded portion of the combinational logic in the first circuit design is equivalent to the expanded portion of the combinational logic in the second circuit design.

12. The apparatus of claim 11, wherein the instructions are configured to cause the one or more processing devices to perform operations further comprising
recording equivalence determinations for each portion of the combinational logic and expanded portion of the combinational logic; and
generating an equivalence output to indicate whether the combinational logic in the first circuit design is equivalent to the combinational logic in a second circuit design.

13. The apparatus of claim 11, wherein sequentially expanding the portions of the combinational logic in the first circuit design and the second circuit design further comprises coupling outputs from the portions of the combinational logic in the first circuit design and the second circuit design to inputs to additional portions of the combinational logic in the first circuit design and the second circuit design.

14. The apparatus of claim 11, wherein output of the first matched register pair is input into the combinational logic corresponding to the second matched register pair.

15. The apparatus of claim 11, wherein the instructions are configured to cause the one or more processing devices to perform operations further comprising:
when the expanded portions of the combinational logic in the first circuit design and the second circuit design are not equivalent, sequentially re-expanding the expanded portions of the combinational logic in the first circuit design and the second circuit design; and
determining whether the re-expanded portion of the combinational logic in the first circuit design is equivalent to the re-expanded portion of the combinational logic in the second circuit design.

* * * * *